United States Patent
Chou et al.

[11] Patent Number: 5,861,345
[45] Date of Patent: Jan. 19, 1999

[54] IN-SITU PRE-PECVD OXIDE DEPOSITION PROCESS FOR TREATING SOG

[76] Inventors: Chin-hao Chou, 7F, 582-6 Chung Cheng Road, Chung Li; Yu-Chen Yang, 149 Tzn Chu Village, Tso Ying; Shing-Hsiang Hung, 37, Lane 26, Kwang-Tung 2nd Street, both of Kao Hsiung, all of Taiwan

[21] Appl. No.: 924,904

[22] Filed: Sep. 8, 1997

Related U.S. Application Data

[63] Continuation of Ser. No. 432,026, May 1, 1995, abandoned.

[51] Int. Cl.$^6$ .................................................. H01L 21/31
[52] U.S. Cl. .......................... 438/763; 438/778; 438/780; 438/782; 438/787; 438/788
[58] Field of Search ..................................... 437/195, 231, 437/228 PL; 438/760, 763, 780, 781, 782, 787, 778, 788

[56] References Cited

U.S. PATENT DOCUMENTS

| | | | |
|---|---|---|---|
| 4,676,867 | 6/1987 | Elkins et al. | 156/643 |
| 5,270,259 | 12/1993 | Ito et al. | 437/235 |
| 5,290,727 | 3/1994 | Jain et al. | 437/52 |
| 5,319,247 | 6/1994 | Matsuura | 257/760 |
| 5,366,910 | 11/1994 | Ha et al. | 438/162 |
| 5,393,702 | 2/1995 | Yang et al. | 437/195 |
| 5,399,533 | 3/1995 | Pramanik et al. | 437/228 |
| 5,413,963 | 5/1995 | Yen et al. | 437/195 |
| 5,429,988 | 7/1995 | Huang et al. | 437/187 |
| 5,457,073 | 10/1995 | Ouellet | 437/231 |

OTHER PUBLICATIONS

C.K. Wang, L.M. Liu, H.C. Cheng, H.C. Huang & M.S. Lin, *A Study of Plasma Treatments on Siloxane SOG*, VMIC Conf., 1994 ISMIC–103/94/101, Jun. 7–8, pp. 101–108.

M. Matsura, Y. Ii, K. Shibata, Y. Hayashide & H. Kotani, *An Advanced Interlayer Dielectric System with Partially Converted Organic SOG by Using Plasma Treatment*, VMIC Conf., 1993 ISMIC–102/93/0113, Jun. 8–9, p. 113–115.

S. Itoh, Y. Homma, E. Sasaki, S. Uchimura & H. Morishima, *Application of Surface Reformed Thick Spin–on–Glass to MOS Device Planarization*, J. Electrochem. Soc., vol. 137, No. 4, Apr. 1990, pp. 1212–1218.

*Primary Examiner*—John F. Niebling
*Assistant Examiner*—Lynne A. Gurley
*Attorney, Agent, or Firm*—Proskauer Rose LLP

[57] ABSTRACT

An in situ inter-dielectric process is disclosed for forming multilevel metal structures. The process includes the steps of:

(1) forming an SOG layer on an uneven semiconductor surface, (2) treating a surface of the SOG layer with a plasma in a PECVD chamber, and (3) forming a PECVD oxide layer on the treated surface in the same PECVD chamber.

The operating parameters for performing the in situ treatment are as follows:

| | |
|---|---|
| Gas: | $N_2O$ or $C_2F_6$ |
| Pressure: | 4–6 Torr |
| Temperature: | 300–400° C. |
| Power: | 200–400 Watts |
| Gap: | 300–800 mil |
| Flow: | 500–1500 sccm |
| Time: | 5–15 sec |

Thus, the treatment can be performed in the same PECVD chamber used to form a PECVD oxide layer on the treated SOG layer.

Furthermore, the SOG layer surface may be oxidized to produce an organic deficient $SiO_x$ layer at the surface of the SOG layer prior to performing the treatment step (2).

16 Claims, 4 Drawing Sheets

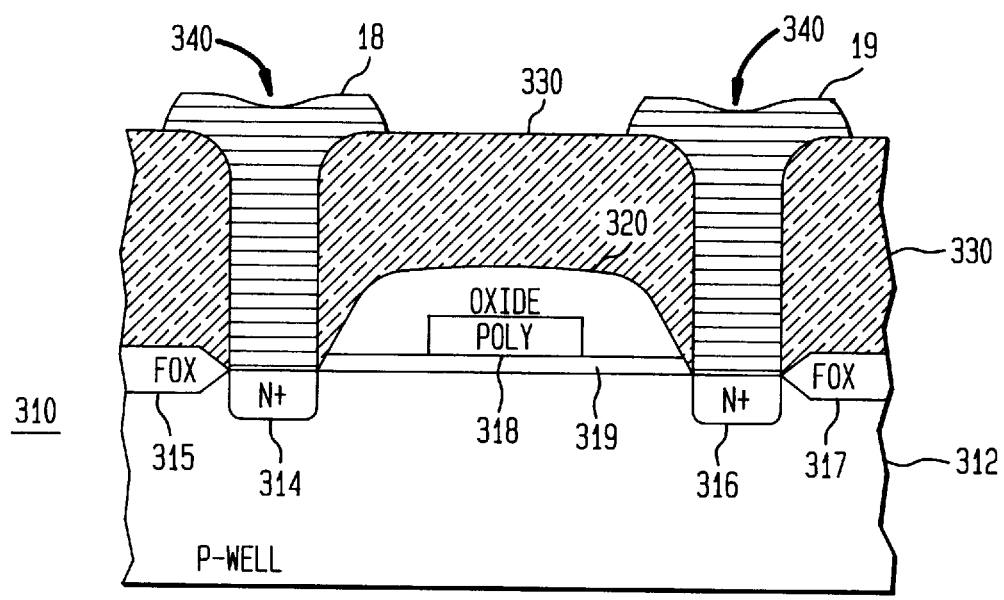

IN-SITU PRE-PECVD OXIDE DEPOSITION PROCESS FOR TREATING SOG

This is a continuation of application Ser. No. 08/432,026, filed May 1, 1995, now abandoned.

FIELD OF THE INVENTION

The present invention relates to semiconductor integrated circuit (IC) fabrication. In particular, the present invention relates to an inter-metal dielectric process which uses two forms of oxides, namely, spin-on glass (SOG) and plasma enhanced chemical vapor deposition (PECVD) oxide.

BACKGROUND OF THE INVENTION

FIGS. 1 and 2A–F illustrate a prior art inter-metal dielectric process for forming multilevel metal structures on an semiconductor IC 10. Such multilevel metal structures may be used, for instance to interconnect several commonly connected devices incorporated in the semiconductor IC 10 such as sources and/or drains of MOS devices. In FIG. 1, first metal I regions 18, 19 of a MOS device 310 are formed, in a conventional manner to be described below. Illustratively, the MOS device 310 is formed in a P-well region 312 of an N-type silicon substrate. N+-type source and drain regions 314 and 316 are formed in the P-well 312. Field oxide (FOX) regions 315, 317 which are relatively thick oxide regions separate the device 310 from adjacent devices formed on the substrate. The gate 318 is made from polysilicon. The gate 318 is separated from the P-well surface by the thin gate oxide 319 and is enclosed by the dielectric 320 which also may be oxide. The device 310 is covered by a pre-metal dielectric layer 330. The layer 330 is illustratively a dual stack of TEOS (Tetraethylorthosilicate) based USG/BPSG (undoped silicon glass/borophosphosilicate glass) with a thickness of 3000–5000 Angstroms. The layer 330 is formed by liquid phase chemical vapor deposition in a vertical furnace.

The metal I regions 18, 19 are formed by etching the dielectric layer 330 to form the openings 340. The etching involves two steps, a BHF wet etch followed by anisotropic dry etch, in which steps the dielectric 330 is 40% and 60% etched, respectively. After the contact openings 340 are first formed, a reflow etch step is used to round the tops of the contact openings. Typically, the contact aspect ratio (depth/width) is about 1.8. Then, the metal contact regions 18, 19 are formed in the openings 340 according to a so-called metal (I) process. A variety of processes have been suggested in the prior art for the metal (I) process, such as, the conventional W(tungsten)-CVD plug process, or an Al-based metallization process.

As shown in FIG. 2A, the metal I regions 18, 19 are separated by portions 22 of the semiconductor IC surface 20. The metal I regions 18, 19 which project from the semiconductor IC surface 20, therefore cause the surface of the semiconductor IC 10 to be uneven or non-planar. Next, as shown in FIG. 2B, the semiconductor IC 10 is placed in a PECVD chamber and a PECVD oxide 24 (referred to as an inter-metal dielectric I or IMD I layer) is formed on the metal I regions 18, 19 and portions 22 of the semiconductor surface 20. As shown, the IMD I layer, by virtue of being formed by a PECVD process, conforms to the uneven semiconductor surface of the IC 10. The surface of the semiconductor IC 10, therefore, is still uneven. To even-off or planarize the surface of the semiconductor IC 10, one or more SOG layers 26 are formed on the IMD I layer 24, as shown in FIG. 2C. An SOG layer is illustratively formed from an organic material such as siloxane. The chemical composition of the SOG layer 26 is $SiO(CH)_x$. The level of organic content effects the ability of the SOG material to fill gaps in the IC surface to make it planar; generally, higher organic content provides for better gap-filling/planarization. As shown, the uppermost SOG layer surface 26 tends to be more even or planar than the semiconductor IC surface on which the SOG layer 26 was formed. Optionally, the SOG layer(s) 26 may be etched back somewhat to improve the planarity. Next, as shown in FIG. 2D, in a PECVD chamber, a second PECVD IMD II layer 28 is formed on the SOG layer(s) 26. As shown in FIG. 2E, after forming the IMD II layer 28, the IMD I 24/SOG 26/IMD II 28 sandwiched layers are patterned using a photolithographic process to form vias 30 (passages that extend perpendicularly to the view depicted in FIG. 2D). The vias 30, 31 are formed in the vicinity of the metal I regions 18, 19, respectively. Thereafter, as shown in FIG. 2F, the vias are filled with metal II regions 32, 33. The metal II regions 32 interconnect each metal I region 18 and the metal II regions 33 interconnect each metal I region 19.

A problem with the above inter-dielectric process relates to the use of the SOG layer(s) 26. See C. K. Wang, L. M. Liu, H. C. Cheng, H. C. Huang & M. S. Lin, *A Study of Plasma Treatments on Siloxane SOG*, VMIC CONF., 1994 ISMIC-103/94/101, June 7–8, p. 101–108; M. Matsura, Y. Ii, K. Shibata, Y. Hayashide & H. Kotani, *An Advanced Interlayer Dielectric System with Partially Converted Organic SOG by Using Plasma Treatment*, VMIC CONF., 1993 ISMIC-102/93/0113, June 8–9, p.113–15; and S. Itoh, Y. Homma, E. Sasaki, S. Uchimura & H. Morishima, *Application of Surface Reformed Thick Spin-on-Glass to MOS Device Planarization*, J. ELECTROCHEM. SOC., vol. 137, no. 4, April 1990, p. 1212–18. In forming the vias in the IMD I 24/SOG 26/IMD II 28 sandwiched layers, a photoresist layer is applied to the surface of the IMD II layer 28 and exposed through a mask to pattern the photoresist layer. The unexposed portions of the photoresist are removed and an etchant is introduced to etch vias through the portions of the IMD I 24/SOG 26/IMD II 28 sandwiched layers not protected by exposed photoresist. The exposed photoresist is then removed. When the exposed photoresist is removed, a portion of the SOG layer on the sidewalls of the vias is exposed to $O_2$ plasma. At such time, alkyl can decompose in the SOG producing moisture. The moisture, in turn, can cause an outgassing effect that can poison the via. The SOG layer can furthermore retrogress or shrink thereby introducing high shear stresses to the surface between the SOG layer 26 and the IMD II layer 28. This can result in cracking of the IMD I 24/SOG 26/IMD II 28 sandwiched layers.

Prior art remedies to this problem are directed to treating the SOG layer to degas/dehydrate/reduce the organic content of the SOG layer prior to adding the IMD II layer. For instance, according to some prior art processes, after forming the SOG layer(s) but before forming the IMD II layer, the semiconductor surface 20 is placed in a furnace and cured at 400°–600° C. S. Ito, Y. Homma, E. Sasaki, S. Uchimura & H. Morishima, *Application of Surface Reformed Thick Spin-on-Glass to MOS Device Planarization*, J. ELECTROCHEM. SOC., vol. 137, no. 4, April 1990, p. 1212–18 compares the curing of SOG layers in $O_2$ and $N_2$. M. Matsuura, Y. Ii, K. Shibata, Y. Hayashide & H. Kotani, *An Advanced Interlayer Dielectric System with*

*Partially Converted Organic SOG by Using Plasma Treatment*, VMIC CONF., 1993 ISMIC-102/93/0113 teaches to treat the SOG layer(s) with $O_2$ plasma at 400° C. for 15 seconds to decompose the alkyl of the organic SOG and then to treat the SOG layer with $N_2$ plasma at 400° C. for one minute. However, the treatment with $O_2$ plasma can result in high moisture absorption. C. K. Wang, L. M. Liu, H. C. Cheng, H. C. Huang & M. S. Lin, *A Study of Plasma Treatments on Siloxane SOG*, VMIC CONF., 1994 ISMIC-103/94/101, June 7–8, p. 101–108 teaches to treat the SOG layer(s) with $N_2O$ or Ar plasma. However, as shown in FIG. 6 of this reference, severe cracks tend to occur using this process.

In each of these processes, the semiconductor IC must be treated ex-situ, i.e., in a different chamber from that used to form the SOG or IMD II layers. Stated another way, to treat the SOG layer according to the prior art, the semiconductor IC must be removed from a first chamber, placed in a second specialized chamber for treatment and then removed for placement in the PECVD chamber. As acknowledged by the prior art, this can cause cracks in the treated SOG layer when the SOG layer is exposed to the ambient environment (i.e., ambient temperature, pressure, etc.) as is required for moving the semiconductor to the PECVD chamber for forming the IIMD II layer. Second, none of the prior art references addresses the issue of delamination which occurs because of poor adhesion between the treated SOG layer and the IMD II layer.

It is therefore an object of the present invention to overcome the disadvantages of the prior art.

SUMMARY OF THE INVENTION

According to one embodiment, an inter-dielectric process illustratively is provided for fabricating multilevel metal structures. The invention illustratively includes the following steps:

(1) forming an SOG layer on an uneven semiconductor surface, (2) treating a surface of the SOG layer with a plasma in a PECVD chamber, and (3) forming a PECVD layer on the treated surface in the same PECVD chamber.

As noted above, the SOG layer contains $SiO(CH)_x$. Illustratively, the SOG layer surface is oxidized to produce an organic deficient $SiO_x$ layer at the surface of the SOG layer prior to performing the treatment step (2).

Illustratively, the treatment is with $N_2O$ or $C_2F_6$ plasma in the PECVD chamber under the following conditions:

| | |
|---|---|
| Pressure: | 4–6 Torr |
| Temperature: | 300–400° C. |
| Power: | 200–400 Watts |
| Gap: | 300–800 mil |
| Flow: | 500–1500 sccm |
| Time: | 5–15 sec |

Such parameters are suitable for performance in the same PECVD chamber as used to form the PECVD layer on the SOG layer. Therefore, the treatment can be performed in situ; the semiconductor IC need not be removed and placed in an additional chamber to treat the SOG layer. This reduces the fabrication time and the likelihood of damage/contamination of the semiconductor IC. Moreover, by treating the SOG layer in situ, the SOG layer need not be exposed to the ambient environment (i.e., ambient temperature, pressure, etc.) prior to forming the IMD II layer. Thus, SOG cracking is reduced. Furthermore, adhesion between the treated SOG layer and IMD II layer is increased, thereby reducing delamination.

BRIEF DESCRIPTION OF THE DRAWING

FIG. 1 illustrates the formation of a metal I layer.

DETAILED DESCRIPTION OF THE INVENTION

Figure 2A:
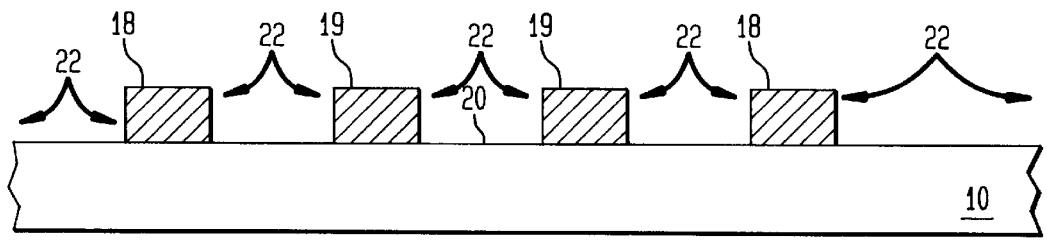
FIGS. 2A–F illustrate a conventional inter-dielectric process for forming a multilevel metal structure on a semiconductor IC.
Figure 2B:
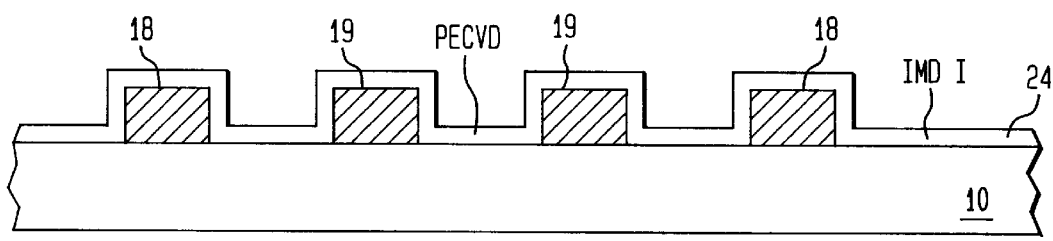
Figure 2C:
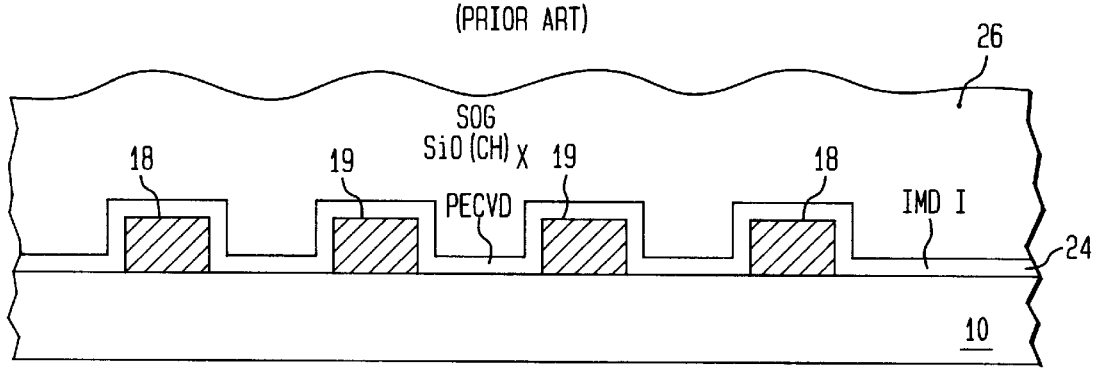
Figure 3A:
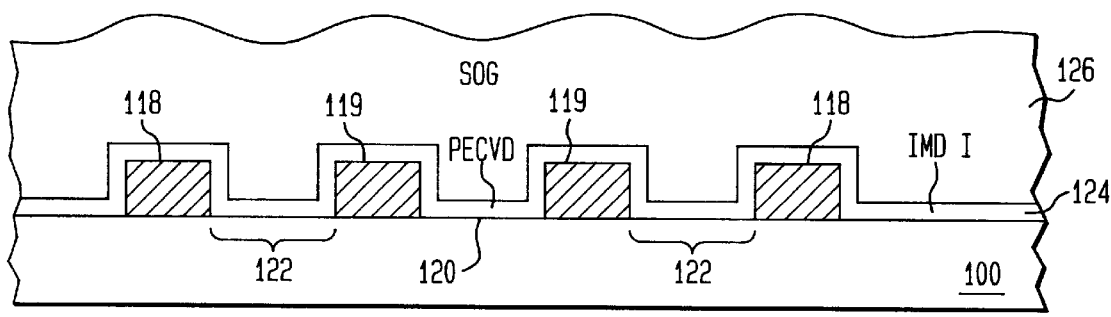
FIGS. 3A–C illustrates an inter-dielectric process according to an embodiment of the present invention.
Figure 3B:
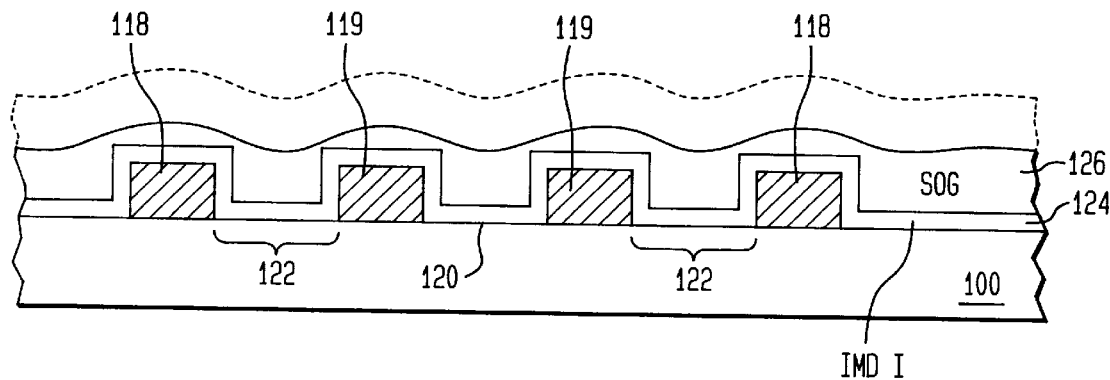
Figure 3C:
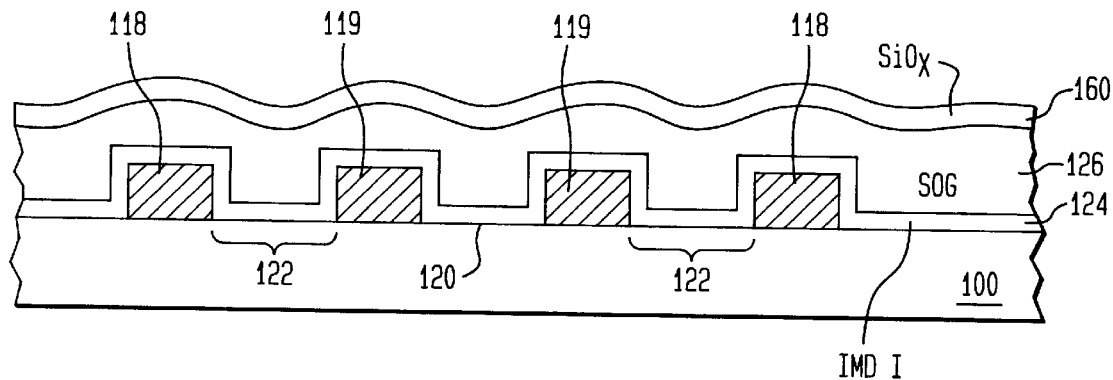

According to an embodiment of the invention, the invention is illustrated using the steps depicted in FIGS. 3A–C. FIG. 3A depicts a semiconductor IC 100 after performing steps similar to those depicted in FIGS. 2A–C. The semiconductor IC 100 illustratively includes devices, such as MOS transistors with source and drain regions. Metal I regions 118 and 119 are illustratively formed on the source and drain regions separated by portions 122 of the semiconductor IC surface 120. Illustratively, the metal I regions 118, 119 have a width of about 0.8 $\mu$m and a thickness of about 0.6 $\mu$m, while the portions 122 may have a width of about 0.5 $\mu$m. A PECVD IMD I layer 124, having a thickness of about 0.2 $\mu$m is formed on the metal I regions 118 and 119 and portions 122 of the semiconductor IC surface 120 that separate the metal I regions 118, 119. One or more SOG layers 126 are formed on the IMD I layer 124 having a thickness in the range of about 0.12–0.36 $\mu$m.

Optionally, the one or more SOG layers 126 may be etched back somewhat as shown in FIG. 3B. For example, using an etchant such as $CF_4$ for about 30 sec, approximately a thickness of 0.15 $\mu$m of the SOG layer(s) 126 may be etched back. Illustratively, this may be done to remove the SOG material from over the metal I regions 118, 119 so as to prevent a high via resistance between the metal II region vias formed over the metal I regions 118, 119.

Either after forming the SOG layer(s) 126 as shown in FIG. 3A, or after performing the etch back as shown in FIG. 3B, the surface of the SOG layer(s) 126 is oxidized as shown in step 2C. This produces an organic deficient layer 160 on the SOG layer comprising the material $SiO_x$ as opposed to the material $SiO(CH)_x$ which is contained in the SOG layer(s) 126. Illustratively, this is achieved by heating the semiconductor at a temperature in the range of about 300°–400° C. in the presence of $O_2$ for a period of time in the range of about 5–15 sec.

Figure 4:
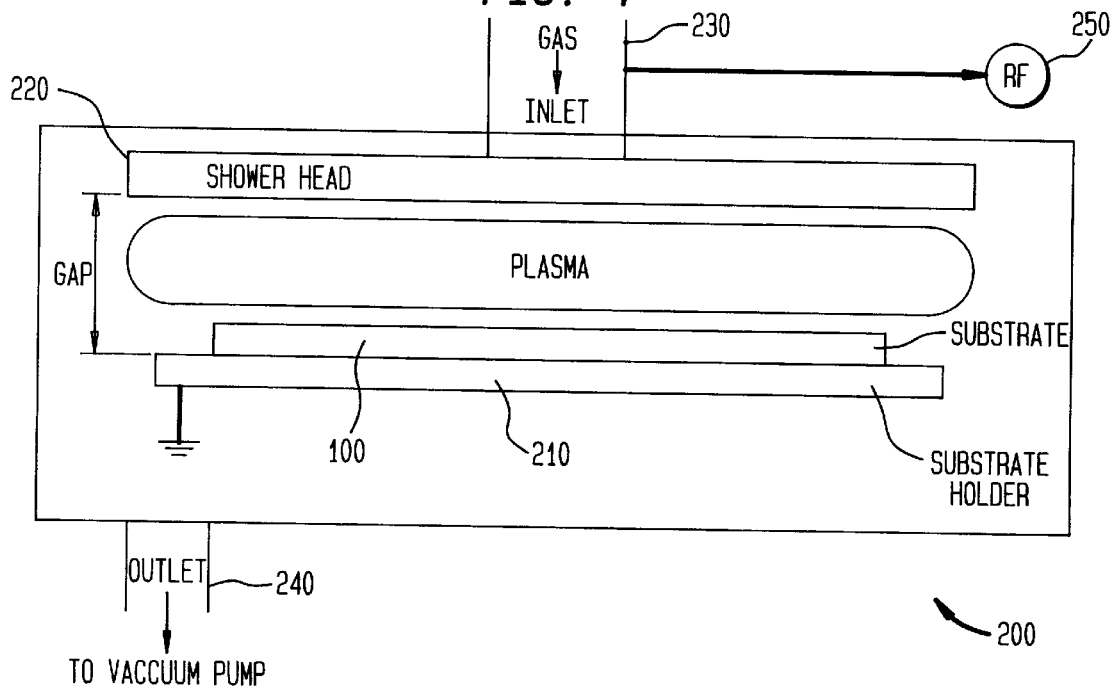
FIG. 4 illustrates the use of a PECVD chamber to treat SOG layers according to the present invention.

Next, as shown in FIG. 4, the organic deficient SOG layer 160 is treated in situ in the PECVD chamber 200 used to form the PECVD IMD II layer. Illustratively, the semiconductor IC 100 is placed on a grounded electrode 210 below a gas diffuser or shower head 220, which is separated from the electrode 210 by a specific gap. The chamber 200 may be evacuated via outlet 240 connected to a vacuum pump (not shown). A gas is introduced via the inlet 230 and diffused via the shower head 220. An appropriate RF signal from RF source 250 of a specified power is applied to the diffused gas to produce a plasma over the semiconductor IC with primary radicals such as O or F. The operating parameters for performing the in situ treatment in the PECVD chamber are as follows:

| | |
|---|---|
| Gas: | $N_2O$ or $C_2F_6$ |
| Pressure: | 4–6 Torr |
| Temperature: | 300–400° C. |
| Power: | 200–400 Watts |
| Gap: | 300–800 mil |
| Flow: | 500–1500 sccm |
| Time: | 5–15 sec |

Figure 2D:
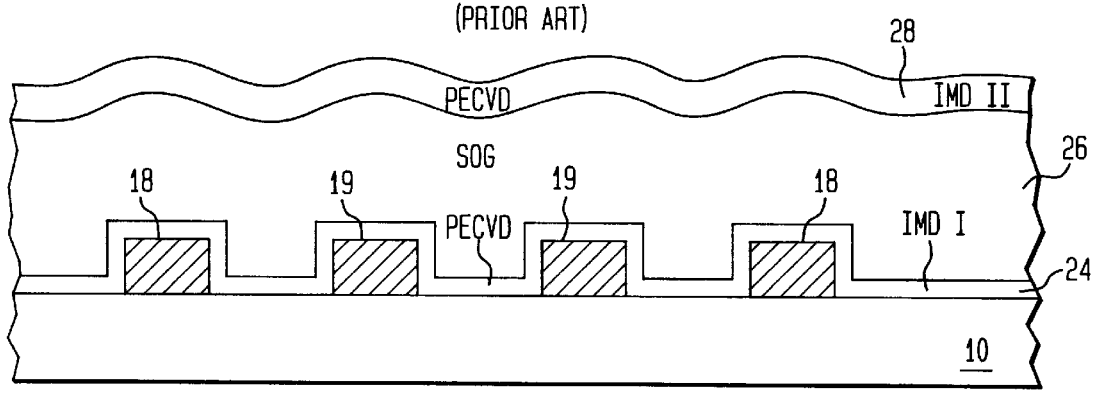
Figure 2E:
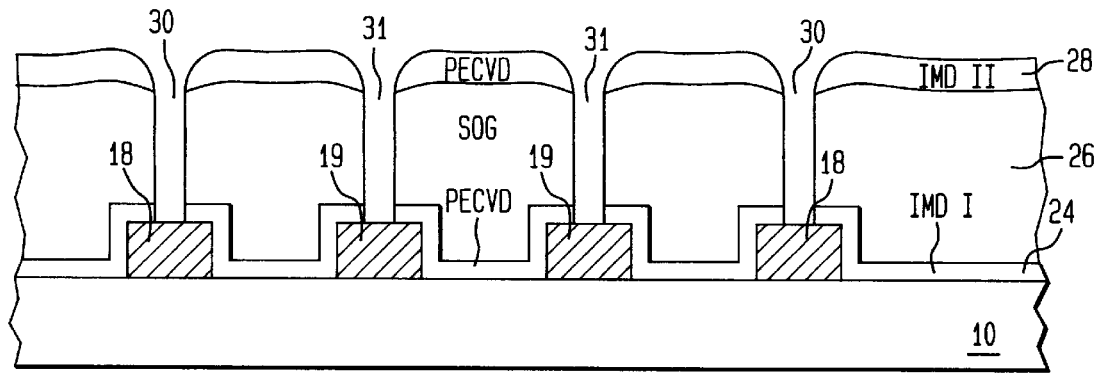
Figure 2F:
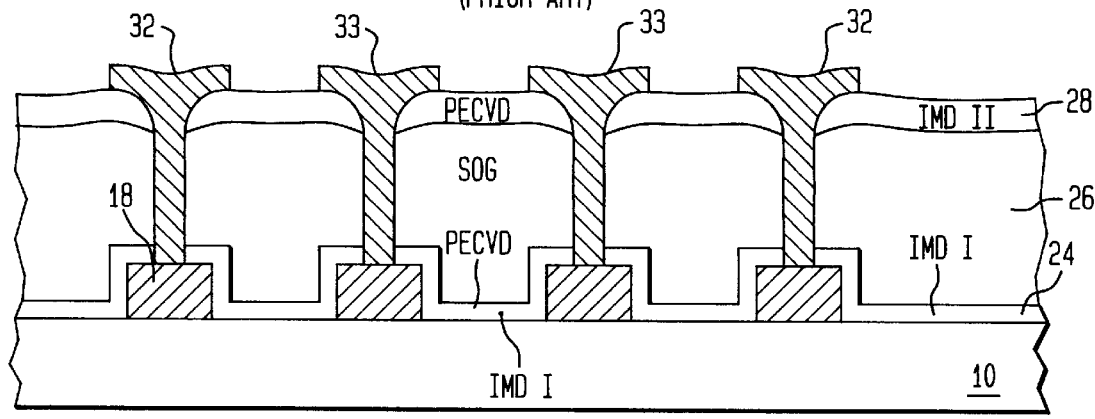

After performing the in situ treatment in the PECVD chamber, the PECVD IMD II layer may be performed in the very same PECVD chamber, i.e., without moving the semiconductor IC to an additional chamber. Illustratively, the remaining steps for forming the PECVD IMD II layer and vias are similar to those described in FIGS. 2D–F. For purpose of brevity they are not repeated herein.

Note that the operating parameters of the in situ treatment are suitable for performance in the very same PECVD chamber in which the PECVD IMD II layer is formed. Specifically, the treatment utilizes a sufficiently low power, and high enough pressure for performance in the PECVD chamber. In contrast, the prior art treatments are not suitable for performance in an PECVD chamber and therefore must be performed ex situ, i.e., in a different chamber than the PECVD chamber used to form the PECVD IMD II layer.

The in situ treatment in the PECVD chamber according to the present invention improves the adhesion of the IMD II layer to the SOG layer(s). This reduces the delamination of the IMD II layer from the SOG layer(s). Furthermore, the treatment offers greater resistance to the above-noted $O_2$ degradation which can occur during photoresist stripping after formation of the vias. Such an in situ treatment, which overcomes the disadvantages of outgassing, poisoned via, production of moisture, retrogression of the SOG layer, etc., also avoids exposing the SOG to the ambient environment (i.e., ambient temperature, pressure, etc.) prior to forming the IMD II layer. This reduces cracking in the SOG layer.

Finally, the above discussion is intended to merely illustrate the invention. Numerous alternative embodiments may be devised by those having ordinary skill in the art without departing from the spirit and scope of the following claims.

The claimed invention is:

1. A process for constructing an inter-metal dielectric comprising the steps of:
    forming an SOG layer on an uneven semiconductor surface,
    treating a surface of said SOG layer with one of a $N_2O$ and $C_2F_6$ reactive gas, in a PECVD chamber for a time between about 5 and 15 seconds, to chemically react with said SOG layer for forming an organic-deficient treated SOG layer, and
    forming a PECVD oxide layer on said treated SOG layer surface in said same PECVD chamber.

2. The method of claim 1 further comprising, prior to said step of forming said SOG layer, the steps of:
    patterning a metal layer on a semiconductor surface to form one or more isolated metal regions separated by portions of said semiconductor surface,
    forming an initial PECVD oxide layer on said metal regions and said portions of said semiconductors surface separating said metal regions so as that said initial PECVD oxide layer has an uneven surface.

3. The method of claim 1 wherein said SOG layer is more smooth than said uneven semiconductor surface.

4. The method of claim 1 wherein, in said step of forming said SOG layer, more than one SOG layer is formed on said uneven semiconductor surface, and wherein, in said step of treating, a surface of an uppermost SOG layer is treated.

5. The method of claim 2 further comprising the steps of:
    patterning said PECVD oxide and said SOG layers to form passages to said metal regions, and
    forming metal filled vias filling said passages and contacting said metal regions.

6. The method of claim 1 wherein said step of treating is performed at a pressure of about 4–6 Torr.

7. The method of claim 6 wherein said step of treating is performed at a power of 200–400 Watts.

8. The method of claim 1 wherein said step of treating is performed at a power of 200–400 Watts.

9. The method of claim 1 wherein said plasma used in said step of treating is formed from a gas selected from the group consisting of $N_2O$ and $C_2F_6$.

10. The method of claim 1 comprising, before said step of treating, the step of oxidizing a surface of said SOG layer.

11. The method of claim 10 wherein said step of oxidizing produces an organic deficient $SiO_x$ layer at said surface of said SOG layer.

12. The method of claim 1 wherein said step of treating improves adhesion of said PECVD layer to said SOG layer.

13. The method of claim 1 wherein said cooperation of said steps of treating and forming said PECVD layer reduces cracking in said SOG layer.

14. The method of claim 1 wherein said steps of treating and forming said PECVD layer avoid exposing said SOG layer to an ambient environment there between.

15. A process for constructing an inter-metal dielectric comprising the steps of:
    forming an SOG layer on an uneven semiconductor surface,
    treating a surface of said SOG layer with one of a $N_2O$ and $C_2F_6$ reactive gas in a PECVD chamber at a pressure between about 4 and 6 Torr for a time between about 5 and 15 seconds, to chemically react with said SOG layer for forming an organic-deficient treated SOG layer, and
    forming a PECVD oxide layer on said treated SOG layer surface in said PECVD chamber.

16. A process for constructing an inter-metal dielectric comprising the steps of:
    forming an SOG layer on an uneven semiconductor surface,
    treating a surface of said SOG layer with one of a $N_2O$ and $C_2F_6$ reactive gas in a PECVD chamber at a power level between about 200 and 400 Watts for a time between about 5 and 15 seconds to chemically react with said SOG layer for forming an organic-deficient treated SOG layer, and
    forming a PECVD oxide layer on said treated SOG layer surface in said PECVD Chamber.

* * * * *